(12) United States Patent
Watanabe

(10) Patent No.: US 6,815,143 B2
(45) Date of Patent: Nov. 9, 2004

(54) RESIST MATERIAL AND PATTERN FORMING METHOD

(75) Inventor: Satoshi Watanabe, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 148 days.

(21) Appl. No.: 10/052,687

(22) Filed: Jan. 18, 2002

(65) Prior Publication Data

US 2002/0136981 A1 Sep. 26, 2002

(30) Foreign Application Priority Data

Jan. 22, 2001 (JP) ........................................ 2001-012947

(51) Int. Cl.$^7$ .......................... G03F 7/004; G03F 7/039
(52) U.S. Cl. .................... 430/270.1; 430/296; 430/326; 430/330; 430/32; 430/913; 430/917; 430/921; 430/942
(58) Field of Search .............................. 430/270.1, 296, 430/326, 330, 327, 942, 913, 917, 921

(56) References Cited

U.S. PATENT DOCUMENTS

| | | | |
|---|---|---|---|
| 5,569,784 A | 10/1996 | Watanabe et al. | 564/430 |
| 5,580,695 A | 12/1996 | Murata et al. | 430/270.1 |
| 5,972,559 A | 10/1999 | Watanabe et al. | 430/270.1 |
| 6,150,068 A | 11/2000 | Sato et al. | 430/270.1 |
| 6,395,446 B1 * | 5/2002 | Seki et al. | 430/170 |
| 6,406,830 B2 * | 6/2002 | Inoue et al. | 430/270.1 |
| 2001/0044070 A1 * | 11/2001 | Uetani et al. | 430/270.1 |

FOREIGN PATENT DOCUMENTS

| | | | |
|---|---|---|---|
| JP | 5249683 | 9/1993 | G03F/7/075 |
| JP | 10048814 A | 2/1998 | G03F/7/004 |
| JP | 10073912 | 3/1998 | G03F/1/00 |
| JP | 10133371 | 5/1998 | G03F/7/029 |
| JP | 10142777 | 5/1998 | G03F/7/004 |
| JP | 10319581 A | 12/1998 | G03F/7/004 |

OTHER PUBLICATIONS

Hinsberg et al., "Fundamental Studies of Airborne Chemical Contamination of Chemically Amplified Resists," *Journal of Photopolymer Science and Technology*, 6(4): 535–546 (1993).

Houlihan et al., "A Study of Resist Outgassing as a Function of Differing Photadditives," *Proc. SPIE*, 3678: 264–274 (1999).

Uetani et al., "Positive ArF Resist with 2EAdMA/GBLMA Resin System," *Proc. SPIE*, 3678: 510–517 (1999).

* cited by examiner

*Primary Examiner*—Yvette C. Thornton
(74) *Attorney, Agent, or Firm*—Myers Bigel Sibley & Sajovec, PA

(57) ABSTRACT

Provided are a PED-stabilizer-containing resist material having high sensitivity and high resolution, and sufficient PED stability; and a pattern forming method using the resist material. More specifically, the resist material contains at least one compound selected from thiol derivatives, disulfide derivatives and thiolsulfonate derivatives. This resist material may further contain a dissolution inhibitor and/or surfactant. The pattern forming method comprises steps of applying the resist material to a substrate; after a heat treatment, exposing the substrate to a high energy beam or electron beam through a photomask; and after an optional heat treatment, developing the resist material with a developer.

16 Claims, No Drawings

RESIST MATERIAL AND PATTERN FORMING METHOD

RELATED APPLICATION

This application claims priority from Japanese Patent Application No. 2001-012947, filed on Jan. 22, 2001, the disclosure of which is incorporated by reference herein in its entirety.

BACKGROUND OF THE INVENTION

1. Field of the Invention

The present invention relates to chemically amplified resist materials having a markedly high alkali dissolution contrast before and after exposure, high sensitivity, high resolution and, in particular, excellent reproducibility as a fine pattern forming material in the fabrication of ultra LSI; and a pattern forming method using the material.

2. Description of the Related Art

With a recent tendency to higher integration and higher operation speed in LSI, finer pattern rules are requested. Under such circumstances, far-ultraviolet lithography is regarded promising as microfabrication technology of the next generation. Particularly, materialization of photolithography using a KrF excimer laser light (wavelength: 248 nm) or ArF excimer laser light (wavelength: 193 nm) as a light source is strongly desired as a technique indispensable for micropatterning of a size of 0.3 $\mu$m or less.

In resist materials for KrF excimer laser lithography, polyhydroxystyrene having a practical level of transmittance and etching resistance is incorporated as a standard base resin. For resist materials for ArF excimer laser lithography, on the other hand, use of polyacrylic or polymethacrylic acid derivatives or polymers containing an aliphatic cyclic compound in the backbone thereof are under investigation. Fundamentally, in either case, some or all of alkali soluble moieties of an alkali soluble resin are protected with an acid eliminative group. The overall performance of a resist material is regulated by selecting a proper acid eliminative protecting group or incorporating, in addition to the resin, at least one low molecular component having a necessary function as desired.

One of the typical functional low molecular components to be added to a resist material is a compound group called "photoacid generator". Photoacid generators having various structures are proposed for KrF excimer laser lithography. Since photoacid generators for ArF excimer laser lithography are limited from the viewpoints of photoacid generation efficiency, intensity of the acid generated and far ultraviolet absorption (i.e. transmittance), the photoacid generators proposed for KrF excimer laser lithography include onium salts capable of generating an acid of high intensity (see for example, F. M. Houlihan, et al., Proc. SPIE 3678, 264–274 (1999); Y. Uetani, et al., Proc. SPIE 3678, 510–517(1999)) or an onium or non-onium salt based photoacid generator having an increased transmittance (see, for example, Japanese Patent Provisional Publication Nos. 10-62995/1998 (U.S. Pat. No. 6,150,068), 10-142777/1998, 10-319581/1998, 10-133371/1998, 10-73912/1998, 10-48814/1998).

Resists for ArF excimer laser lithography are required to have a sufficiently high sensitivity to prevent a deterioration of a lens glass material which presumably occurs upon mass production owing to high energy beams of the ArF excimer laser, high transparency in an ArF excimer laser (wavelength: 193 nm) region and high PED (Post Exposure Delay) stability. Low PED stability is one of the largest obstacle for mass production. In spite of many reports on a lowering mechanism of PED stability of a resist for KrF excimer laser lithography which resist is environmetally unstable (see W. Hinsberg, et al., J. Photopolym. Sci. Technol., 6(4), 535–546(1993)) and PED stabilizers (Japanese Patent Provisional Publication Nos. 5-232706/1993 (U.S. Pat. No. 5,580,695), 5-249683/1993, 7-252214/1995 (U.S. Pat. No. 5,569,784) and 10-20504/1998 (U.S. Pat. No. 5,972,559)), there are almost no reports on a PED stabilizer for a resist suited for ArF excimer laser lithography which resist is more environmetally unstable. There is accordingly a demand for the development of means for resolving this problem.

Under a tendency to finer pattern rules, a resist material having high PED stability, high transmittance, high sensitivity and high resolution is demanded.

SUMMARY OF THE INVENTION

With the foregoing in view, the present invention has been made. An object of the present invention is to provide (1) a PED-stabilizer-containing resist material having high sensitivity and high resolution as well as sufficient PED stability; and (2) a pattern formation method using the resist material.

With a view to attaining the above-described object, the present inventors have proceeded with an extensive investigation. As a result, it has been found that at least one compound selected from thiol derivatives, disulfide derivatives and thiolsulfonate derivatives each being a chain transfer agent which is used upon radical polymerization and functions as a radical trap agent is useful as a PED stabilizer to be incorporated in a resist material; particularly, a resist material containing at least one compound selected from thiol derivatives, disulfide derivatives and thiolsulfonate derivatives free of a carbon-carbon double bond has high transmittance, high sensitivity and high resolution; and this resist material is markedly effective for accurate microprocessing, leading to the completion of the present invention.

In one aspect of the present invention, there is thus provided a resist material comprising at least one compound selected from thiol derivatives, disulfide derivatives and thiolsulfonate derivatives. This resist material may further contain a dissolution inhibitor and/or surfactant.

In another aspect of the present invention, there is also provided a pattern forming method, which comprises steps of applying the resist material to a substrate; after a heat treatment, exposing the resist material to a high energy beam or electron beam through a photomask; and after an optional heat treatment, developing the resist material with a developer.

The resist material of the invention is responsive to high energy beams. Owing to excellent sensitivity, resolution, etching resistance and storage stability, it is useful for microprocessing by electron beams or far ultraviolet rays. In particular, small absorption thereof at an exposure wavelength of ArF excimer laser or KrF excimer laser facilitates formation of patterns which are minute and moreover, perpendicular to a substrate.

DETAILED DESCRIPTION OF THE PREFERRED EMBODIMENTS

The present invention will hereinafter be described in detail.

The resist material of the invention is usable as a resist material preferably for far ultraviolet rays of 150 to 250 nm, especially for those of 190 to 200 nm.

The resist material of the invention contains at least one compound selected from thiol derivatives, disulfide derivatives and thiolsulfonate derivatives, of which those free of a carbon-carbon double bond are preferred. The "thiol derivatives", "disulfide derivatives" and "thiolsulfonate derivatives" as used herein are mercapto (—SH)-containing compounds, disulfide (—S—S—) linkage-containing compounds and thiolsulfonate (—S—SO$_2$—) linkage-containing compounds, respectively. The thiol derivatives, disulfide derivatives and thiolsulfonate derivatives, each free of a carbon-carbon double bond are C=C-bond-free thiol derivatives, disulfide derivatives and thiolsulfonate derivatives.

The following are Examples of the thiol derivatives, disulfide derivatives and thiolsulfonate derivatives which can be incorporated in the resist material of the invention, but they are not limited to the below-exemplified ones.

invention is preferably 0.01 to 20 parts by weight, more preferably 0.1 to 5 parts by weight, based on 100 parts by weight of a base resin. Amounts less than 0.01 part by weight may not bring about sufficient effects as a PED stabilizer. Amounts exceeding 20 parts by weight, on the other hand, may lower resolution.

The resist material of the invention comprises at least one compound selected from thiol derivatives, disulfide derivatives and thiolsulfonate derivatives and can be used as a positive type, a negative type or a posi-nega type. It can be used preferably as a chemically amplified resist material, more preferably as a chemically amplified positive resist material. The resist material may further comprise a base resin, a compound which generates an acid in response to high energy beams or electron beams, and an organic solvent.

The resin to be used in the invention is an alkali insoluble resin or alkali sparingly soluble resin having a transmittance,

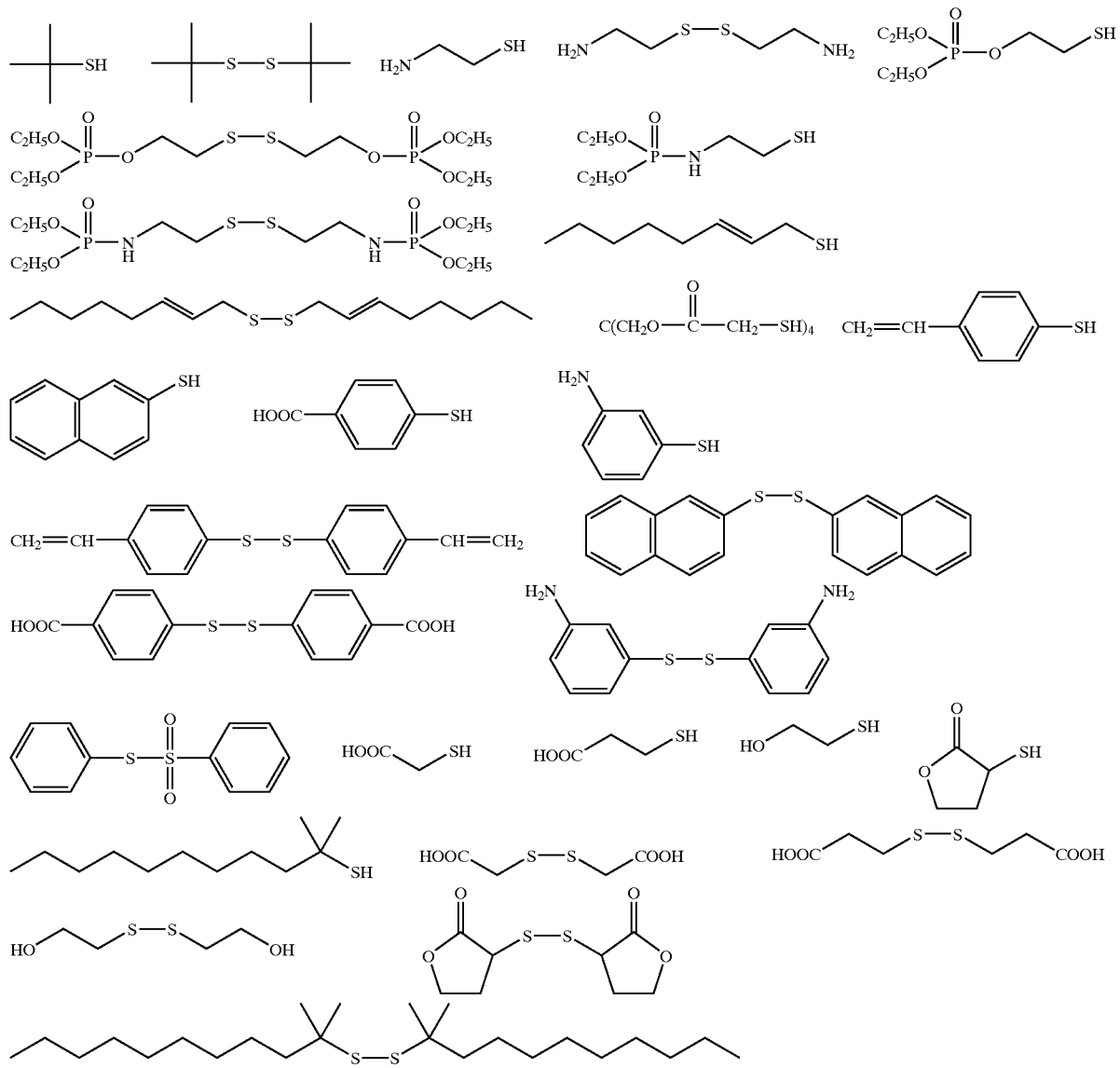

The amount of at least one compound selected from the thiol derivatives, disulfide derivatives and thiolsulfonate derivatives to be incorporated in the resist material of the invention is preferably 0.01 to 20 parts by weight, more at a wavelength of 193 nm, of 30%/μm or greater and being protected with an acid labile group. The resin comprises an alicyclic structure having a —(CO)—O—(CO)$_k$— group (wherein, k stands for 0 or 1) which becomes alkali soluble by the dissociation of the acid labile group. Whether the transmittance at a wavelength of 193 nm exceeds 30%/μm or not can be determined by measuring a resist film applied to a quartz substrate by a transmittance analyzer. The term "alkali insoluble or alkali sparingly soluble" means that the solubility in a 2.38 wt % aqueous solution of TMAH (tetramethylammonium hydroxide) falls within a range of from 0 to less than 2 nm (20 Å)/sec, while the term "alkali soluble" means that the solubility therein is 20 to 300 Å/sec.

Examples of the base resin usable in the invention include, but not limited thereto, resins having a weight-average molecular weight of 1,000 to 500,000, preferably 5,000 to 100,000 as measured by gel permeation chromatography (GPC) using polystyrene as a standard.

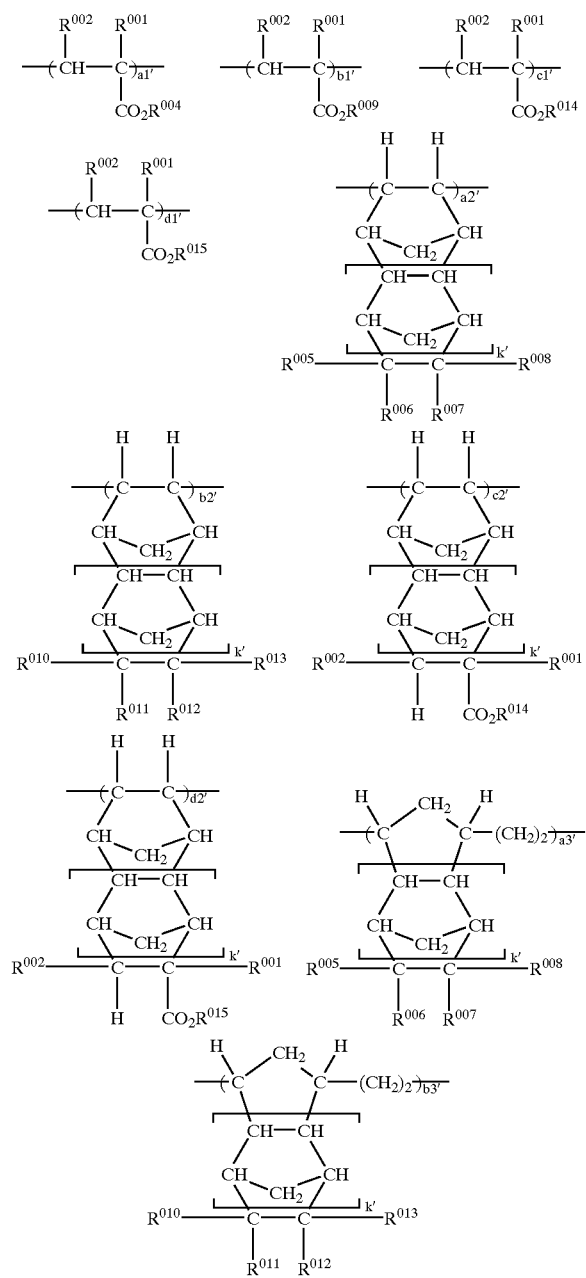

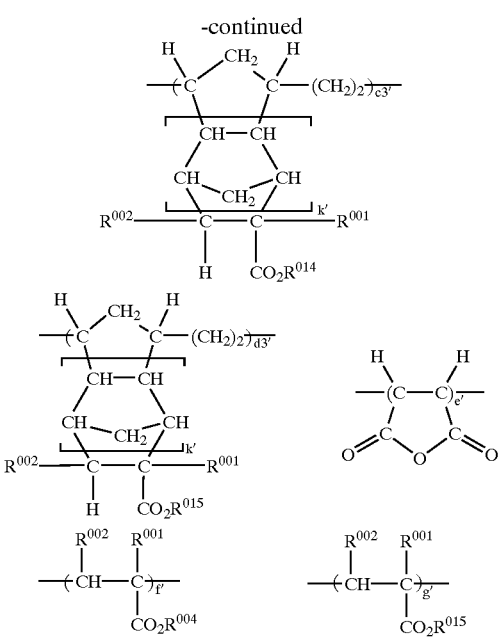

In the above formulas, $R^{001}$ represents a hydrogen atom, a methyl group or $CH_2CO_2R^{003}$.

$R^{002}$ represents a hydrogen atom, a methyl group or $CH_2CO_2R^{003}$.

$R^{003}$ represents a linear, branched or cyclic $C_{1-15}$ alkyl group. Examples thereof include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl groups.

$R^{004}$ represents a hydrogen atom or a monovalent carboxyl- or hydroxyl-containing $C_{1-15}$ hydrocarbon group. Examples thereof include carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl and hydroxyadamantyl groups.

At least one of $R^{005}$ to $R^{008}$ represents a monovalent carboxyl- or hydroxyl-containing $C_{1-15}$ hydrocarbon group, while the others each independently represents a hydrogen atom or a linear, branched or cyclic $C_{1-15}$ alkyl group. Examples of the monovalent carboxyl- or hydroxyl-containing $C_{1-15}$ hydrocarbon group include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl and hydroxyadamantyloxycarbonyl groups. Examples of the linear, branched or cyclic $C_{1-15}$ alkyl groups include those exemplified above as $R^{003}$.

$R^{005}$ to $R^{008}$ may form a ring each other. In this case, at least one of $R^{005}$ to $R^{008}$ represents a divalent carboxyl- or hydroxyl-containing $C_{1-15}$ hydrocarbon group, while the others each independently represents a linear, branched or cyclic $C_{1-15}$ alkylene group. Examples of the divalent carboxyl- or hydroxyl-containing $C_{1-15}$ hydrocarbon group include those exemplified above as the carboxy- or hydroxyl-containing monovalent hydrocarbon group but with one hydrogen atom being removed therefrom. Examples of the linear, branched or cyclic $C_{1-15}$ alkylene group include those exemplified as $R^{003}$ but with one hydrogen atom being removed therefrom.

$R^{009}$ represents a monovalent $C_{3-15}$ hydrocarbon group containing a —$CO_2$— partial structure. Examples thereof include 2-oxooxolan-3-yl, 4,4-dimethyl-2-oxooxolan-3-yl, 4-methyl-2-oxooxan-4-yl, 2-oxo-1,3-dioxolan-4-ylmethyl and 5-methyl-2-oxooxolan-5-yl.

At least one of $R^{010}$ to $R^{013}$ represents a monovalent $C_{2-15}$ hydrocarbon group having a —$CO_2$— partial structure, while the others each independently represents a hydrogen atom or a linear, branched or cyclic $C_{1-15}$ alkyl group. Examples of the monovalent $C_{2-15}$ hydrocarbon group having a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl groups. Examples of the linear, branched or cyclic $C_{1-15}$ alkyl group include those exemplified above as $R^{003}$.

$R^{010}$ to $R^{013}$ may form a ring each other. In this case, at least one of $R^{010}$ to $R^{013}$ represents a divalent $C_{1-15}$ hydrocarbon group having a —$CO_2$— partial structure and the others each independently represents a linear, branched or cyclic $C_{1-15}$ alkylene group. Examples of the divalent $C_{1-15}$ hydrocarbon group having a —$CO_2$— partial structure include 1-oxo-2-oxapropane-1,3-diyl, 1,3-dioxo-2-oxapropane-1,3-diyl, 1-oxo-2-oxabutane-1,4-diyl and 1,3-dioxo-2-oxabutane-1,4-diyl. In addition, those exemplified above as the monovalent hydrocarbon group having a —$CO_2$— partial structure but with one hydrogen atom being removed therefrom can be included. Examples of the linear, branched or cyclic $C_{1-15}$ alkylene group include those exemplified above as $R^{003}$ but with one hydrogen atom being removed therefrom.

$R^{014}$ represents a $C_{7-15}$ polycyclic hydrocarbon group or alkyl group containing a polycyclic hydrocarbon group. Examples thereof include norbornyl, bicyclo[3.3.1]nonyl, tricyclo[5.2.1.0$^{2,6}$]decyl, adamantyl, ethyladamantyl, butyladamantyl, norbornylmethyl and adamantylmethyl groups.

$R^{015}$ represents an acid labile group.

The letter k' stands for 0 or 1. Each of a1', a2', a3', b1', b2', b3', c1', c2', c3', d1', d2', d3' and e' stands for a number of from 0 but less than 1 and satisfies the following equation: a1'+a2'+a3'+b1'+b2'+b3'+c1'+c2'+c3'+d1'+d2'+d3'+e'=1. The letters f' and g' each represents a number of from 0 but less than 1 and satisfies the following equation: f'+g'=1.

Examples of the acid labile group represented by $R^{105}$ include groups represented by the below formulas (A-1) to (A-3), $C_{4-20}$, preferably $C_{4-15}$ tertiary alkyl groups, trialkylsilyl groups with each alkyl having 1 to 6 carbon atoms, and $C_{4-20}$ oxoalkyl groups.

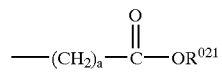 (A1)

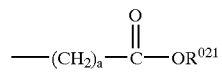

(A2)

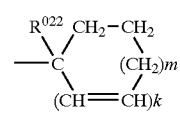 (A3)

In the above-described formulas, $R^{018}$ and $R^{019}$ each independently represents a hydrogen atom or a linear, branched or cyclic $C_{1-18}$, preferably $C_{1-10}$ alkyl groups. Examples thereof include methyl, ethyl, propyl, isopropyl, n-butyl, sec-butyl, tert-butyl, cyclopentyl, cyclohexyl, 2-ethylhexyl and n-octyl groups. $R^{020}$ represents a monovalent $C_{1-18}$, preferably $C_{1-10}$ hydrocarbon group which may have a hetero atom such as oxygen atom. Examples thereof include linear, branched or cyclic alkyl groups in which some hydrogen atoms may be replaced by a hydroxyl, alkoxy, oxo, amino, or alkylamino group. Examples thereof include the substituted alkyl groups below.

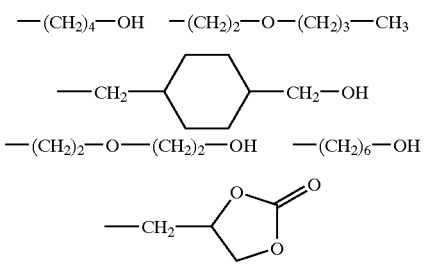

A pair of $R^{018}$ and $R^{019}$, $R^{018}$ and $R^{020}$, or $R^{019}$ and $R^{020}$ may each form a ring. When they form a ring, $R^{018}$, $R^{019}$ and $R^{020}$ each independently represents a linear or branched $C_{1-18}$, preferably $C_{1-10}$ alkylene group.

$R^{021}$ represents a $C_{4-20}$, preferably $C_{4-15}$ tertiary alkyl group, a trialkylsilyl group with each alkyl having 1 to 6 carbon atoms, a $C_{4-20}$ oxoalkyl group or a group represented by the above formula (A-1). Examples of the tertiary alkyl group include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl and 2-methyl-2-adamantyl groups. Examples of the trialkylsilyl group include trimethylsilyl, triethylsilyl and dimethyl-tert-butylsilyl groups, while those of the oxoalkyl group include 3-oxocyclohexyl, 4-methyl-2-oxooxan-4-yl and 5-methyl-2-oxooxolan-5-yl groups. The letter a stands for an integer of 0 to 6.

$R^{22}$ represents a linear, branched or cyclic $C_{1-8}$ alkyl group or a substituted or unsubstituted $C_{6-20}$ aryl group. Examples of the linear, branched or cyclic alkyl group include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl groups. Examples of the substituted or unsubstituted aryl group include phenyl, methylphenyl, naphthyl, anthryl, phenanthryl and pyrenyl groups. k stands for 0 or 1 and m stands for any one of 0, 1, 2 and 3, and at the same time, they satisfy the equation: 2k+m=2 or 3.

Among the acid labile groups represented by the formula (A-1), linear or branched ones will be exemplified below.

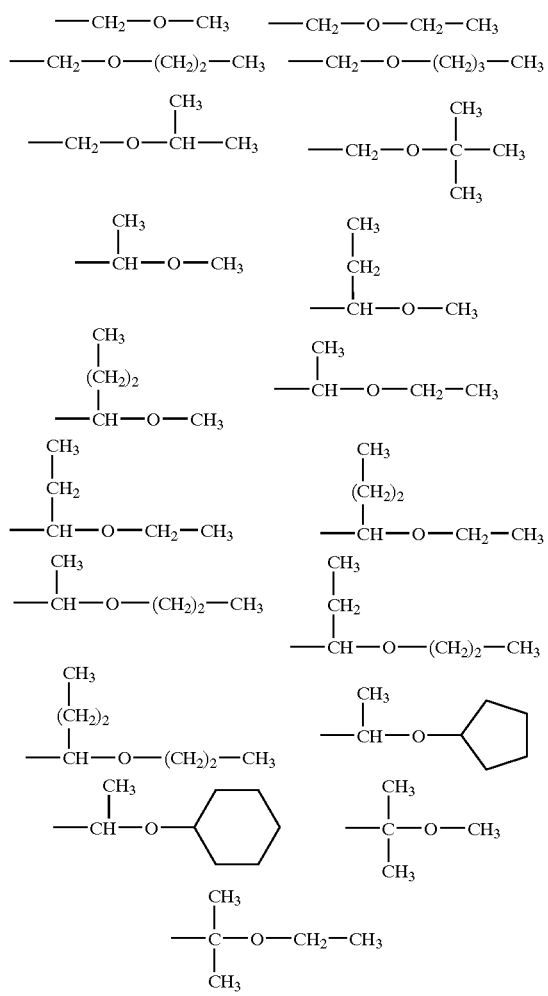

On the other hand, cyclic acid labile groups represented by the formula (A-1) will be exemplified below.

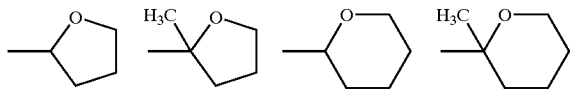

Examples of the acid labile group represented by the formula (A-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl and 2-tetrahydrofuranyloxycarbonylmethyl groups.

Examples of the acid labile group represented by the formula (A-3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl and 3-ethyl-1-cyclohexen-3-yl groups.

The base resin has a weight-average molecular weight of 1,000 to 500,000, preferably 5,000 to 100,000. Weight-average molecular weights outside this range may cause a marked deterioration in etching resistance or lowered resolution owing to difficulty in maintaining a difference in rates of dissolution before and after exposure.

Examples of the compound (which will hereinafter be called "photoacid generator") generating an acid, responsive to high energy beams or electron beams include:

i: onium salts of the below formula (P1a-1), (P1a-2) or (P1b),
ii): diazomethane derivatives of the below formula (P2),
iii): glyoxime derivatives of the below formula (P3),
iv): sulfonate esters of N-hydroxyimide compounds represented by the below formula (P5),
v): β-ketosulfonic acid derivatives,
vi): disulfone derivatives,
vii): nitrobenzylsulfonate derivatives, and
viii): sulfonate ester derivatives.

P1a-1

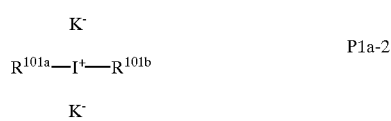

P1a-2 wherein, $R^{101a}$, $R^{101b}$ and $R^{101c}$ each independently represents a linear, branched or cyclic $C_{1-12}$ alkyl, alkenyl, oxoalkyl or oxoalkenyl group, a $C_{6-20}$ aryl group, or a $C_{7-12}$ aralkyl or aryloxoalkyl group, in which the hydrogen atoms of said group may be partially or completely substituted by an alkoxy group or the like; or $R^{101b}$ and $R^{101c}$ may form a ring and when they form a ring, $R^{101b}$ and $R^{101c}$ each independently represents a $C_{1-6}$ alkylene group, and $K^-$ represents a non-nucleophilic counter ion.

$R^{101a}$, $R^{101b}$ and $R^{101c}$ may be the same or different. Examples of the alkyl group include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl groups. Examples of the alkenyl group include vinyl, allyl, propenyl, butenyl, hexenyl and cyclohexenyl groups. Examples of the oxoalkyl group include 2-oxocyclopentyl and 2-oxocyclohexyl as well as 2-oxopropyl, 2-cyclopentyl-2-oxoethyl, 2-cyclohexyl-2-oxoethyl and 2-(4-methylcyclohexyl)-2-oxoethyl groups. Examples of the aryl group include phenyl and naphthyl, alkoxyphenyl groups such as p-methoxyphenyl, m-methoxyphenyl, o-methoxyphenyl, ethoxyphenyl, p-tert-butoxyphenyl and m-tert-butoxyphenyl, alkylphenyl groups such as 2-methylphenyl, 3-methylphenyl, 4-methylphenyl, ethylphenyl, 4-tert-butylphenyl, 4-butylphenyl and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Examples of the aralkyl group include benzyl, phenylethyl and phenethyl. Examples of the aryloxoalkyl group include 2-aryl-2-oxoethyl groups such as 2-phenyl-2-oxoethyl, 2-(1-naphthyl)-2-oxoethyl and 2-(2-naphthyl)-2-oxoethyl. Examples of the non-nucleophilic counter ion $K^-$ include halide ions such as chloride ions and bromide ions, fluoroalkylsulfonates such as triflate, 1,1,1- trifluoroethane sulfonate and nonafluorobutanesulfonate, arylsulfonates such as tosylate, benzenesulfonate, 4-fluorobenzenesulfonate and 1,2,3,4,5-pentafluorobenzenesulfonate and alkylsulfonates such as mesylate and butanesulfonate.

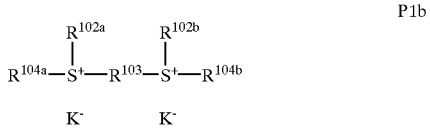

P1b wherein, $R^{102a}$ and $R^{102b}$ each independently represents a linear, branched or cyclic $C_{1-8}$ alkyl group, $R^{103}$ represents a linear, branched or cyclic $C_{1-10}$ alkylene group, $R^{104a}$ and $R^{104b}$ each independently represents a $C_{3-7}$ 2-oxoalkyl group and $K^-$ represents a non-nucleophilic counter ion.

Examples of $R^{102a}$ and $R^{102b}$ include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl and cyclohexylmethyl groups. Examples of $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexanedimethylene groups. Examples of $R^{104a}$ and $R^{104b}$ include 2-oxopropyl, 2-oxocyclopentyl, 2-oxocyclohexyl and 2-oxocycloheptyl groups. Examples of the counter ion $K^-$ include those described in the formulas (P1a-1) and (P1a-2).

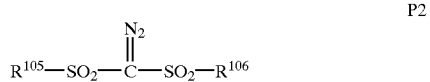

P2 wherein, $R^{105}$ and $R^{106}$ each independently represents a linear, branched or cyclic $C_{1-12}$ alkyl or haloalkyl group, a $C_{6-20}$ aryl or haloaryl group, or a $C_{7-12}$ aralkyl group.

Examples of the alkyl group represented by $R^{105}$ and $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl and adamantyl groups. Examples of the haloalkyl group include trifluoromethyl, 1,1,1-trifluoroethyl, 1,1,1-trichloroethyl and nonafluorobutyl groups. Examples of the aryl group include a phenyl group, alkoxyphenyl groups such as p-methoxyphenyl, m-methoxyphenyl, o-methoxyphenyl, ethoxyphenyl, p-tert-butoxyphenyl and m-tert-butoxyphenyl, and alkylphenyl groups such as 2-methylphenyl, 3-methylphenyl, 4-methylphenyl, ethylphenyl, 4-tert-butylphenyl, 4-butylphenyl and dimethylphenyl. Examples of the haloaryl group include fluorophenyl, chlorophenyl and 1,2,3,4,5-pentafluorophenyl. Examples of the aralkyl group include benzyl and phenethyl.

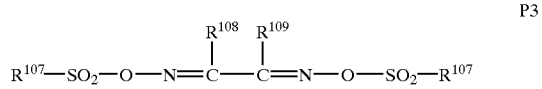

P3 wherein, $R^{107}$, $R^{108}$ and $R^{109}$ each independently represents a linear, branched or cyclic $C_{1-12}$ alkyl or haloalkyl group, a $C_{6-20}$ aryl or haloaryl group, or a $C_{7-12}$ aralkyl group, or $R^{108}$ and $R^{109}$ may be coupled to form a cyclic structure and when they form a cyclic structure, $R^{108}$ and $R^{109}$ each independently represents a linear, branched or cyclic $C_{1-6}$ alkylene group).

The alkyl, haloalkyl, aryl, haloaryl and aralkyl groups of $R^{107}$, $R^{108}$ or $R^{109}$ are similar to those exemplified as $R^{105}$ and $R^{106}$. Examples of the alkylene group of $R^{108}$ and $R^{109}$ include methylene, ethylene, propylene, butylene and hexylene groups.

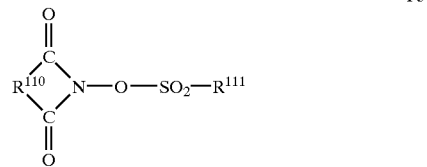

P5 wherein, $R^{110}$ represents a $C_{6-10}$ arylene group, $C_{1-6}$ alkylene group or $C_{2-6}$ alkenylene group in which the hydrogen atoms may be partially or completely substituted by a linear or branched $C_{1-4}$ alkyl or alkoxy group, a nitro group, an acetyl group or a phenyl group, and $R^{111}$ represents a linear, branched or cyclic $C_{1-8}$ alkyl, alkenyl or alkoxyalkyl group, phenyl group or naphthyl group in which the hydrogen atoms may be partially or completely substituted by a $C_{1-4}$ alkyl or alkoxy group; a phenyl group which may be substituted by a $C_{1-4}$ alkyl, alkoxy, nitro or acetyl group; a $C_{3-5}$ hetero-aromatic group, or a chlorine; or fluorine atom.

With regards to the groups represented by $R^{110}$, examples of the arylene group include 1,2-phenylene and 1,8-naphthylene; those of the alkylene group include methylene, 1,2-ethylene, 1,3-propylene, 1,4-butylene, 1-phenyl-1,2-ethylene and norbornane-2,3-diyl; and those of the alkenylene group include 1,2-vinylene, 1-phenyl-1,2-vinylene and 5-norbornen-2,3-diyl. With regards to the groups represented by $R^{111}$, examples of the alkyl group are those exemplified as $R^{101a}$ to $R^{101c}$; those of the alkenyl group include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl and 7-octenyl; those of the alkoxyalkyl group include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl and methoxyheptyl.

With regards to substituents on these groups, examples of the $C_{1-4}$ alkyl group include methyl, ethyl, propyl, isopropyl, n-butyl, isobutyl and t-butyl, those of the $C_{1-4}$ alkoxy group include methoxy, ethoxy, propoxy, isopropoxy, n-butoxy, isobutoxy and tert-butoxy, those of the phenyl group which may be substituted by a $C_{1-4}$ alkyl, alkoxy, nitro or acetyl include phenyl, tolyl, p-tert-butoxyphenyl, p-acetylphenyl and p-nitrophenyl; and those of the $C_{3-5}$ hetero-aromatic group include pyridyl and furyl.

As described above, examples of the photoacid generator include onium salts, diazomethane derivatives, glyoxime derivatives, β-ketosulfone derivatives, nitrobenzylsulfonate derivatives, sulfonate ester derivatives and sulfonate esters of an N-hydroxyimide compound.

Examples of onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tertbutoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenyulsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbonyl)methyl(2-oxocyclohexyl)sulfonium trifluoromethanesulfonate, ethylenebis[methyl(2-oxocyclopentyl)sulfonium trifluoromethanesulfonate] and 1,2'-naphthylcarbonylmethyltetrahydrothiophenium triflate.

Examples of the diazomethane derivatives include bis (benzenesulfonyl)diazomethane, bis(p-toluenesulfonyl) diazomethane, bis(xylenesulfonyl)diazomethane, bis (cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl) diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime and bis-O-(camphorsulfonyl)-α-dimethylglyoxime.

Examples of the bissulfone derivatives include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyldisulfone and dicyclohexyldisulfone.

Examples of the nitrobenzyl sulfonate derivatives include 2,6-dinitrobenzyl p-toluenesulfonate and 2,4-dinitrobenzyl p-toluenesulfonate.

The sulfonate ester derivatives include 1,2,3-tris (methanesulfonyloxy)benzene, 1,2,3-tris (trifluoromethanesulfonyloxy)benzene and 1,2,3-tris(p-toluenesulfonyloxy)benzene.

The sulfonate esters of N-hydroxyimide compounds include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonate esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations. In general, onium salts have excellent effects for improving rectangularity, while diazomethane derivatives and glyoxime derivatives have excellent effects for reducing standing waves. The combination of the onium salt with the diazomethane or glyoxime derivative permits fine adjustment of the profile.

The photoacid generator is added preferably in an amount of 0.1 to 15 parts by weight, more preferably 0.5 to 8 parts by weight, per 100 parts by weight of the base resin. At an amount less than 0.1 part by weight, sensitivity may be below the tolerance limit, while at an amount exceeding 15 parts by weight, the transmittance may be lowered, thereby deteriorating the resolution, or heat resistance may be lowered because of the excess amount of a low molecular component.

As the organic solvent, any organic solvent capable of dissolving therein the thiol derivative, disulfide derivative, thiolsulfonate derivative, base resin, photoacid generator, and other additives may be used in the invention. Examples of such an organic solvent include, but not limited to, ketones such as cyclohexanone and methyl-2-n-amylketone, alcohols such as 3-methoxybutanol, 3-methyl-3-methoxybutanol, 1-methoxy-2-propanol, and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used either singly or in combination. Of these organic solvents, diethylene glycol dimethyl ether and 1-ethoxy-2-propanol are preferred because a photoacid generator, which is one of the resist components, is most soluble therein; and propylene glycol monomethyl ether acetate which is a safe solvent and a mixture thereof are also preferred.

The organic solvent is preferably added in an amount of 200 to 1,000 parts by weight, especially 400 to 800 parts by weight per 100 parts by weight of the base resin.

To the resist composition of the invention, an ester compound of the below formula (1) can be added as a dissolution inhibitor.

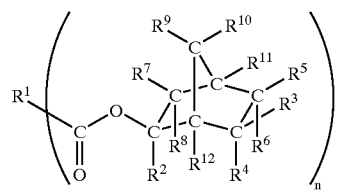

(1)

In the above formula, $R^1$ represents a linear, branched or cyclic, saturated or unsaturated hydrocarbon group which has 4 to 40 carbon atoms, has a valency of n (n stands for 1 to 8) and may contain a hetero atom.

Examples thereof include hydrocarbons which are obtained by removing n pieces of hydrogen atoms at any position on the below hydrocarbons (i) to (v) and introducing bonds, and have in total 4 to 40 carbon atoms: (i) linear or branched aliphatic saturated hydrocarbons having 4 to 30, preferably 6 to 25, more preferably 8 to 20 carbon atoms or alicyclic saturated hydrocarbons of the below formulas of Group A; (ii) the hydrocarbons of (i) in which one or plural hydrogen atoms at any position thereof have each been substituted by a linear, branched or cyclic alkyl group having preferably 1 to 20, especially 1 to 10 carbon atoms; (iii) hydrocarbons of (i) or (ii) in which a carbon-carbon bond at any position thereof has been unsaturated and one or plural double bonds or triple bonds have been introduced; (iv) hydrocarbons of (i) to (iii) in which one or plural $CH_2$s, CHs or Cs at any position have each been substituted by O, N, NH, S, SO or $SO_2$; and (v) hydrocarbons of (i) to (iv) in which one or plural hydrogen atoms at any position have each been substituted by the below atomic group containing a hetero atom (such as oxygen, nitrogen, sulfur or halogen) or alkyl or aryl group containing this atomic group.

Examples of the hetero-atom-containing atomic group include halogen atoms such as fluorine, chlorine and bromine, a hydroxyl group, alkoxy groups such as methoxy, ethoxy, butoxy and tert-butoxy, aryloxy groups such as phenyloxy, a formyl group, alkylcarbonyl groups such as methylcarbonyl and tert-butylcarbonyl, arylcarbonyl groups such as phenylcarbonyl, a carboxy group, alkoxycarbonyl groups such as methoxycarbonyl and tert-butoxycarbonyl, aryloxycarbonyl groups such as phenyloxycarbonyl, a cyano group, an amino group, alkylamino groups such as methylamino and dimethylamino, arylamino groups such as phenylamino and diphenylamino, a mercapto group, alkylthio groups such as methylthio, arylthio groups such as phenylthio, a carbamoyl group, alkylcarbamoyl groups such as dimethylcarbamoyl, arylcarbamoyl groups such as diphenylcarbamoyl, alkylcarbonylamino groups such as methylcarbonylamino, arylcarbonylamino groups such as phenylcarbonylamino, a sulfo group, an oxo group and an imino group, as well as alkyl and aryl groups each containing this atomic group whose examples include alkyl groups such as methyl, ethyl and butyl and aryl groups such as phenyl, each containing in the above-described atomic group.

$R^1$ has 4 to 40, preferably 6 to 35, more preferably 8 to 30 carbon atoms as a whole group.

Group A

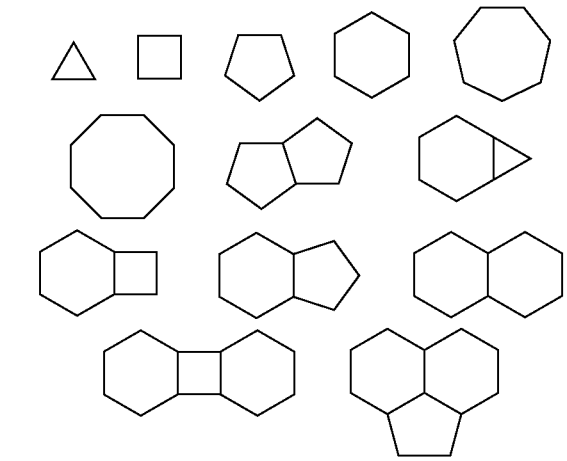

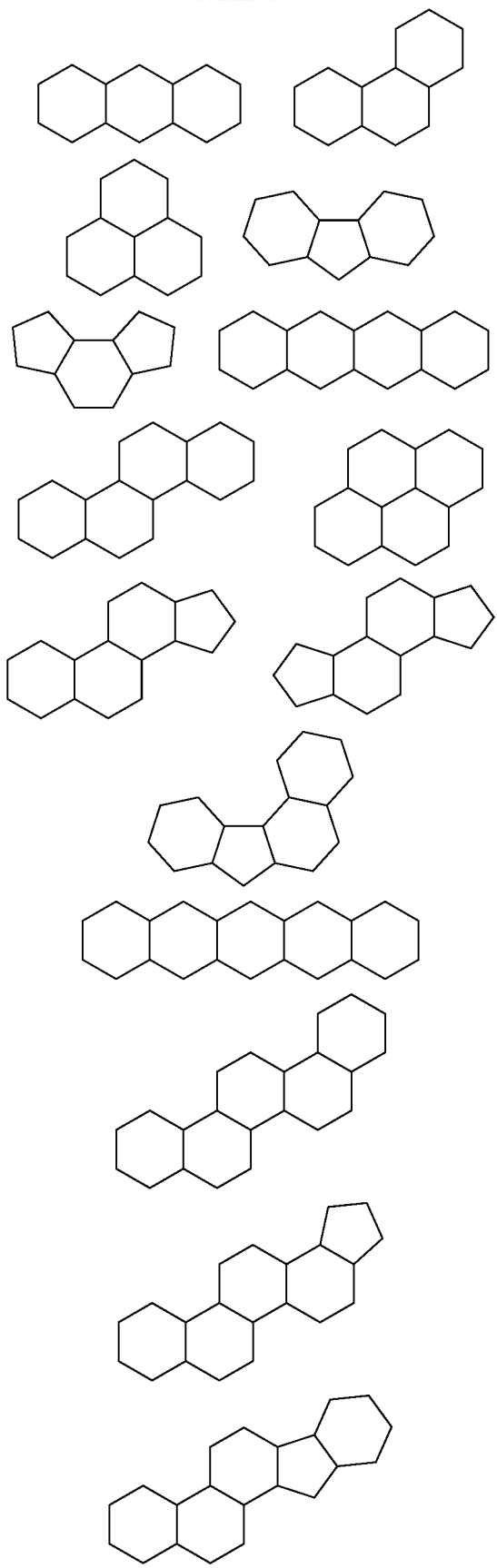
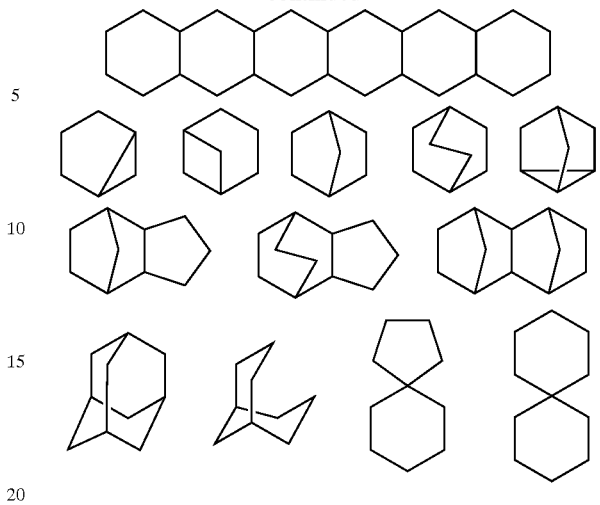

$R^2$ represents a linear, branched or cyclic $C_{1-8}$ alkyl group or an aryl group which may be substituted by a $C_{6-20}$ alkyl group. Examples of the linear, branched or cyclic $C_{1-8}$ alkyl group include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, chclohexylmethyl and cyclohexylethyl groups, while those of the aryl group which may be substituted by the $C_{6-20}$ alkyl group include phenyl, methylphenyl, naphthyl, anthryl, phenanthryl and pyrenyl groups.

$R^3$ to $R^{12}$ each independently represents a hydrogen atom or a linear, branched or cyclic $C_{1-15}$ alkyl group which is unsubstituted or substituted by an atomic group selected from the group consisting of halogen atoms, a hydroxyl group, alkoxy groups, aryloxy groups, a formyl group, alkylcarbonyl groups, arylcarbonyl groups, a carboxy group, alkoxycarbonyl groups, aryloxycarbonyl groups, a cyano group, an amino group, alkylamino groups, arylamino groups, a mercapto group, alkylthio groups, arylthio groups, a carbamoyl group, alkylcarbamoyl groups, arylcarbamoyl groups, alkylcarbonylamino groups, arylcarbonylamino groups, a sulfo group, an oxo group and an imino group. Pairs of $R^3$ and $R^4$, $R^3$ and $R^5$, $R^4$ and $R^6$, $R^5$ and $R^6$, $R^5$ and $R^7$, $R^5$ and $R^{10}$, $R^5$ and $R^{11}$, $R^6$ and $R^8$, $R^6$ and $R^{11}$, $R^7$ and $R^8$, $R^7$ and $R^9$, $R^7$ and $R^{11}$, $R^8$ and $R^{11}$, $R^9$ and $R^{10}$, $R^9$ and $R^{11}$, and $R^{10}$ and $R^{11}$ may each independently form a ring and in this case, they each independently represents a linear, branched or cyclic $C_{1-15}$ alkylene group which is unsubstituted or substituted by an atomic group selected from the group consisting of halogen atoms, a hydroxyl group, alkoxy groups, aryloxy groups, a formyl group, alkylcarbonyl groups, arylcarbonyl groups, a carboxy group, alkoxycarbonyl groups, aryloxycarbonyl groups, a cyano group, an amino group, alkylamino groups, arylamino groups, a mercapto group, alkylthio groups, arylthio groups, a carbamoyl group, alkylcarbamoyl groups, arylcarbamoyl groups, alkylcarbonylamino groups, arylcarbonylamino groups, sulfo group, oxo group and imino group. The pairs of $R^3$ and $R^5$, $R^5$ and $R^{11}$, $R^7$ and $R^{11}$, and $R^9$ and $R^{11}$ may form a single bond, thereby forming a carbon-carbon double bond to which they are bonded.

This atomic group is similar to those exemplified above in $R^1$.

In the formula (1), n stands for an integer of 1 to 8, preferably 1 to 6, more preferably 1 to 4.

Examples of the ester compound of the formula (1) include, but not limited to, the below-described ones and those exemplified in Examples.

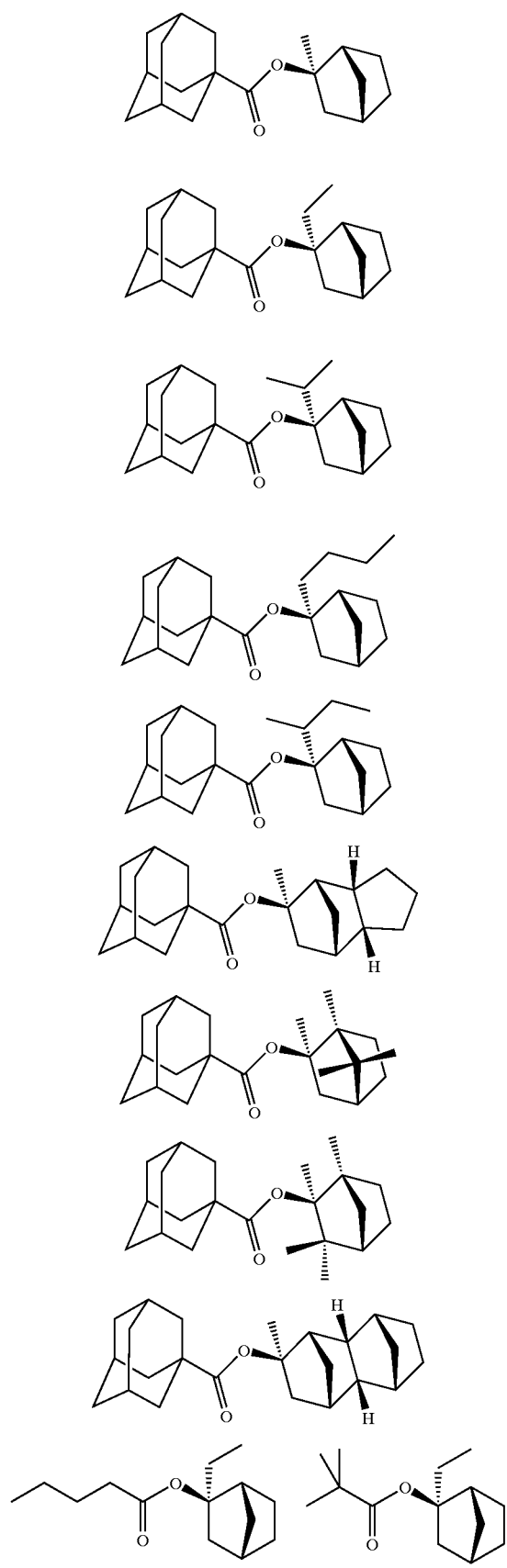
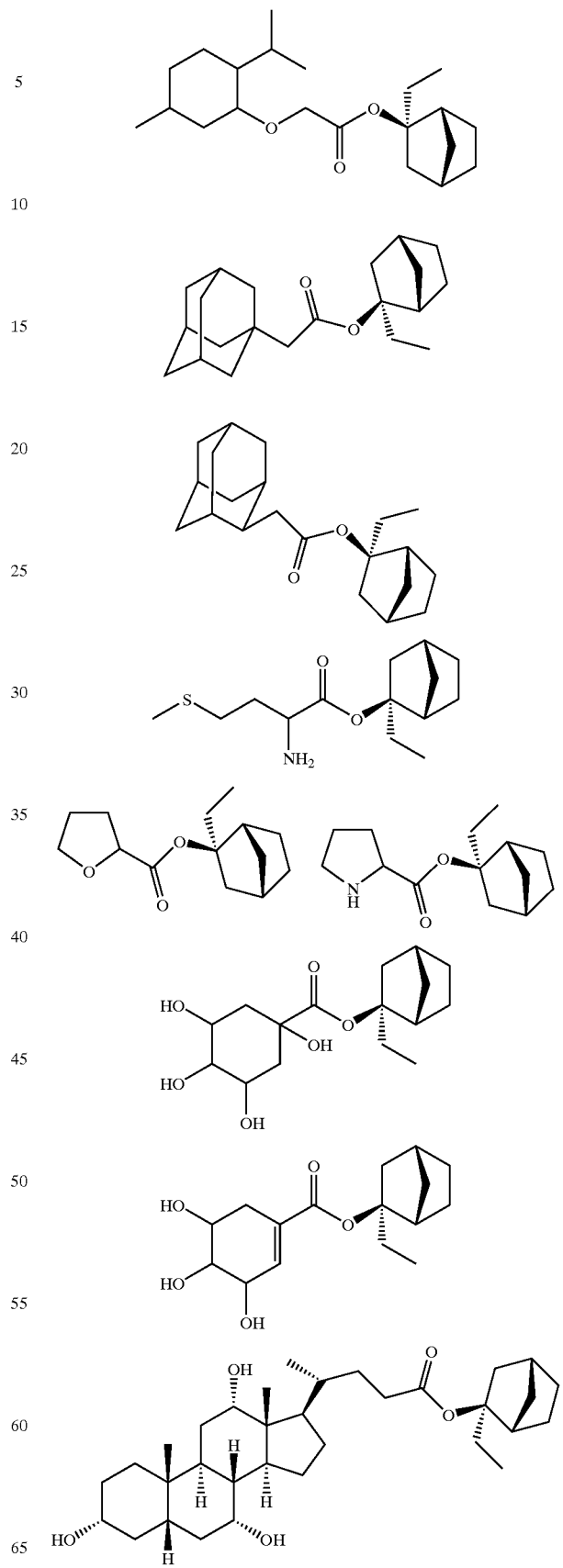

-continued
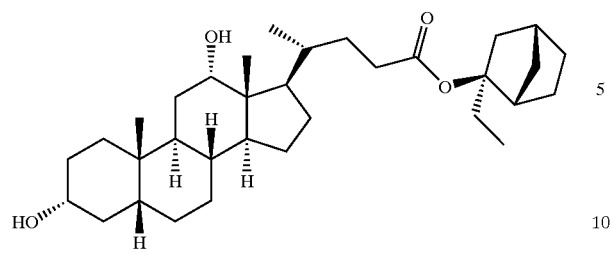
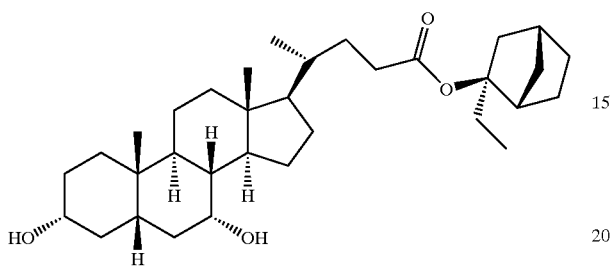
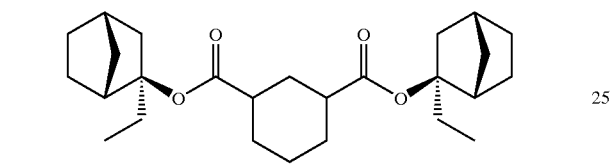
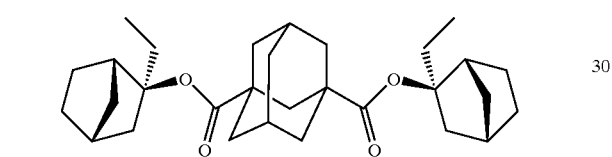
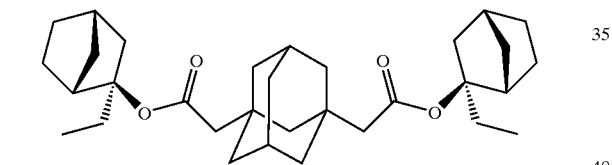
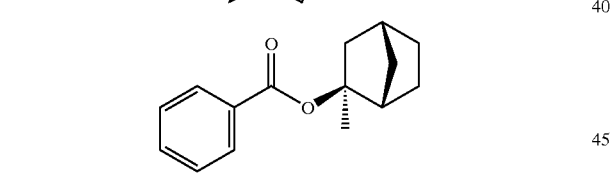
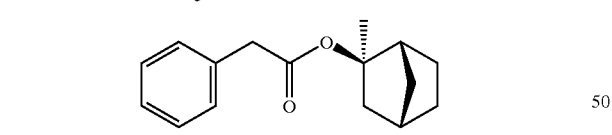
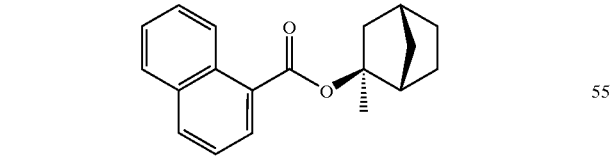
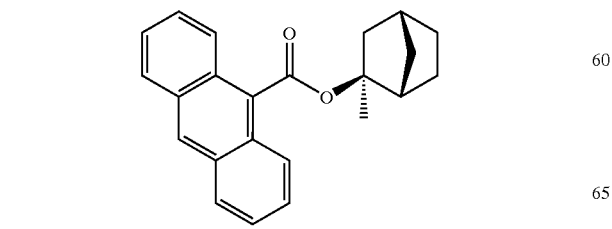
-continued
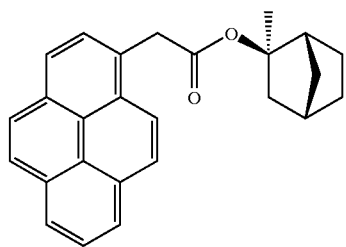
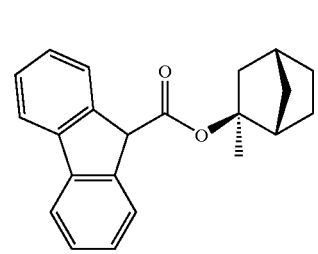
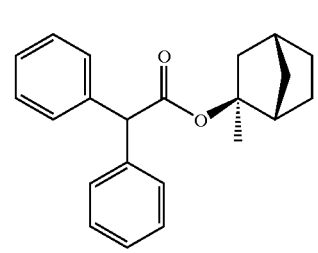
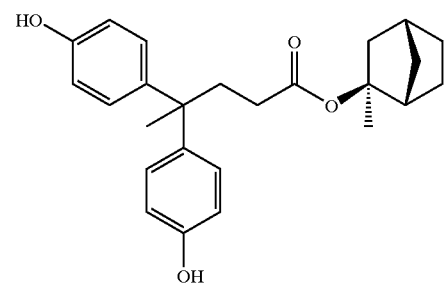
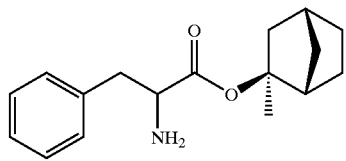
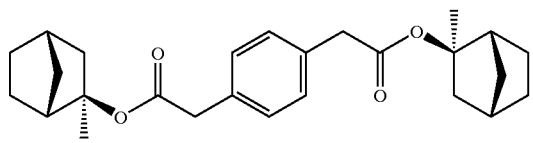
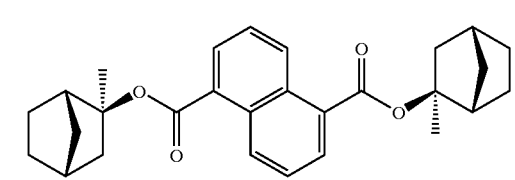

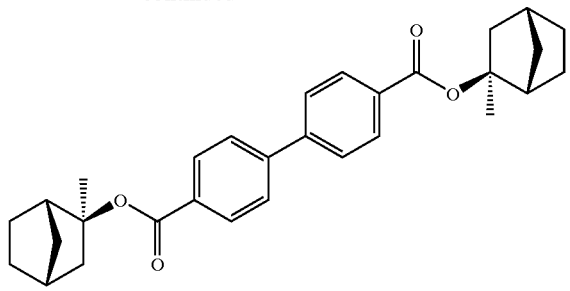

The dissolution inhibitor is added in an amount of 0 to 50 parts, preferably 5 to 50 parts, more preferably 10 to 30 parts, per 100 parts of the base resin. The above-exemplified dissolution inhibitors may be used either singly or in combination. At amounts less than 5 parts by weight, resolution may not be improved, while amounts exceeding 50 parts by weight cause thinning in the patterned film, thereby deteriorating resolution.

The dissolution inhibitor can be synthesized by introducing an acid labile group into a carboxyl-containing compound in accordance with an organic chemical technique.

In the resist composition of the invention, a basic compound may be incorporated.

The suitable basic compound can suppress in the resist film the diffusion rate of the acid generated by the photoacid generator. The addition of such a basic compound suppresses the rate of acid diffusion in the resist film, thereby improving resolution. In addition, it suppresses a change in sensitivity after exposure and reduces dependence on a substrate or environment, thereby improving the exposure latitude, pattern profile or the like.

Examples of basic compounds include primary, secondary, and tertiary aliphatic amines, mixed amines, aromatic amines, heterocyclic amines, carboxyl-containing nitrogenous compounds, sulfonyl-containing nitrogenous compounds, hydroxyl-containing nitrogenous compounds, hydroxyphenyl-containing nitrogenous compounds, alcoholic nitrogenous compounds, amide derivatives, and imide derivatives.

Examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines include dimethylamine, diethylamine, di-n-propylamine, di-isopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the mixed amines include dimethylethylamine, methylethylpropylamine, benzylamine, phenethylamine, and benzyldimethylamine. Examples of the aromatic and heterocyclic amines include aniline derivatives (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole, and N-methylpyrrole), oxazole derivatives (such as oxazole and isooxazole), thiazole derivatives (such as thiazole and isothiazole), imidazole derivatives (such as imidazole, 4-methylimidazole, and 4-methyl-2-phenylimidazole), pyrazole derivatives, furazan derivatives, pyrroline derivatives (such as pyrroline and 2-methyl-1-pyrroline), pyrrolidine derivatives (such as pyrrolidine, N-methylpyrrolidine, pyrrolidinone, and N-methylpyrrolidone), imidazoline derivatives, imidazolidine derivatives, pyridine derivatives (such as pyridine, methylpyridine, ethylpyridine, propylpyridine, butylpyridine, 4-(1-butylpentyl-)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-containing nitrogenous compounds include aminobenzoic acid, indolecarboxylic acid, and amino acid derivatives (such as nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of the sulfonyl-containing nitrogenous compounds include 3-pyridinesulfonic acid and pyridinium p-toluenesulfonate. Examples of the hydroxyl-containing nitrogenous compounds, hydroxyphenyl-containing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-

(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide. Examples of the amide derivatives include formamide, N-methylformamide, N,N-dimethylformamide, acetamide, N-methylacetamide, N,N-dimethylacetamide, propionamide, and benzamide. Examples of the imide derivatives include phthalimide, succinimide, and maleimide.

In addition, basic compounds of the following formulas (B1) and (B2) may also be incorporated.

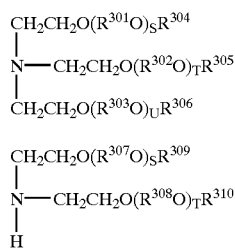

wherein, $R^{301}$, $R^{302}$, $R^{303}$, $R^{307}$ and $R^{308}$ each independently represents a linear, branched or cyclic $C_{1-20}$ alkylene group; $R^{304}$, $R^{305}$, $R^{306}$, $R^{309}$ and $R^{310}$ each independently represents a hydrogen atom, a $C_{1-20}$ alkyl group, an alkylcarbonyl group or an amino group; $R^{304}$ and $R^{305}$, $R^{304}$ and $R^{306}$, $R^{305}$ and $R^{307}$, $R^{304}$ with $R^{305}$ and $R^{306}$, and $R^{309}$ and $R^{310}$ may be coupled to form rings; and S, T and U each independently stands for an integer of 0 to 20, with the proviso that $R^{304}$, $R^{305}$, $R^{306}$, $R^{309}$ and $R^{310}$ are free of a hydrogen atom when S, T and U are equal to 0.

The alkylene group represented by $R^{301}$, $R^{302}$, $R^{303}$, $R^{307}$ or $R^{308}$ has 1 to 20, preferably 1 to 10, and more preferably 1 to 8 carbon atoms. Examples thereof include methylene, ethylene, n-propylene, isopropylene, n-butylene, isobutylene, n-pentylene, isopentylene, hexylene, nonylene, decylene, cyclopentylene, and cyclohexylene.

The alkyl group represented by $R^{304}$, $R^{305}$, $R^{306}$, $R^{309}$ or $R^{310}$ has 1 to 20, preferably 1 to 8, more preferably 1 to 6 carbon atoms, and may be straight, branched or cyclic. Examples thereof include methyl, ethyl, n-propyl, isopropyl, n-butyl, isobutyl, tert-butyl, n-pentyl, isopentyl, hexyl, nonyl, decyl, dodecyl, tridecyl, cyclopentyl and cyclohexyl.

Where $R^{304}$ and $R^{305}$, $R^{304}$ and $R^{306}$, $R^{305}$ and $R^{306}$, $R^{304}$ with $R^{305}$ and $R^{306}$, or $R^{309}$ and $R^{310}$ form a ring, the ring has 1 to 20, preferably 1 to 8, and more preferably 1 to 6 carbon atoms, and may have a branching alkyl group having 1 to 6, especially 1 to 4 carbon atoms.

S, T, and U each independently stands for an integer of 0 to 20, preferably 1 to 10, and more preferably 1 to 8.

Examples of the compounds of formula (B1) or (B2) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, tris(2-acetoxyethyl)amine, tris(2-isobuteryloxyethyl)amine, tris(2-propionyloxyethyl)amine, tris(2-valeryloxyethyl)amine, tris(2-butyryloxyethyl)amine, tris(2-pivaloyloxyethyl)amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Particularly preferred examples include tertiary amines, aniline derivatives, pyrrolidine derivatives, pyridine derivatives, quinoline derivatives, amino acid derivatives, hydroxyl-containing nitrogenous compounds, hydroxyphenyl-containing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The basic compound is preferably added in an amount of 0.001 to 10 parts by weight, preferably 0.01 to 1 part by weight, per 1 part by weight of the photoacid generator. When the amount is less than 0.001 part by weight, effects of it may not be attained sufficiently, while use of more than 10 parts by weight may result in lowering in resolution or sensitivity.

In the resist material of the invention, a compound having a group of $\equiv$C—COOH in the molecule thereof can be incorporated.

As the compound having a group of $\equiv$C—COOH in the molecule thereof, one or more compounds selected from the below-described Group I and Group II is usable, but the compound is not limited thereto. Addition of this compound improves the PED stability of the resist and ameliorates edge roughness on a nitride film substrate.

[Group I]

Compounds in which the hydrogen atoms on the phenolic hydroxyl group of the compounds of the below formulas (A1) to (A10) have been partially or completely substituted by —$R^{401}$—COOH (wherein $R^{401}$ represents a linear or branched $C_{1-10}$ alkylene group), and in which the phenolic hydroxyl group (C) and the group $\equiv$C—COOH (D) in the molecule satisfies the following molar ratio C/(C+D) of from 0.1 to 1.0.

[Group II]

Compounds represented by the below formulas (A11) to (A15):

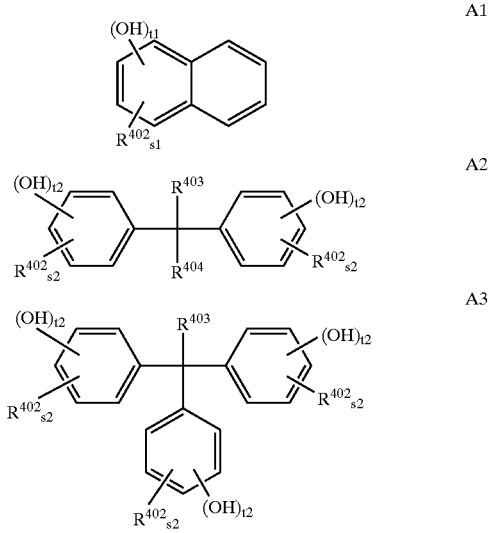

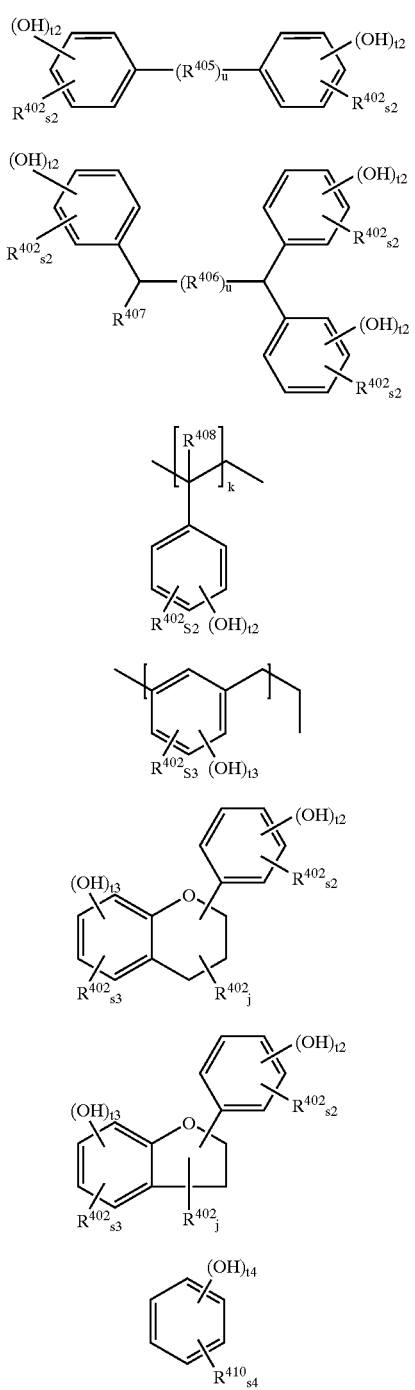

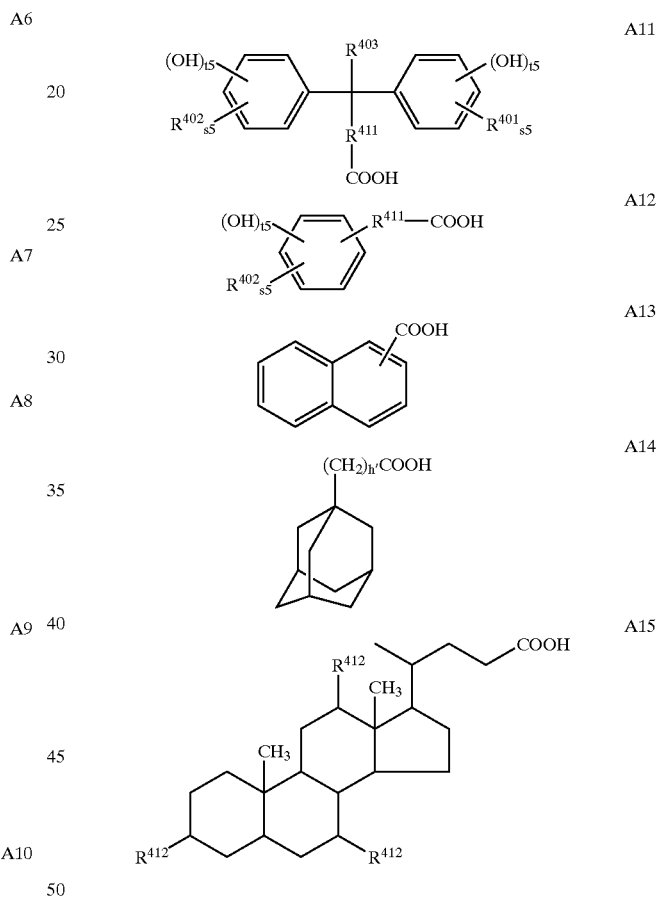

wherein, $R^{408}$ represents a hydrogen atom or a methyl group; $R^{402}$ and $R^{403}$ each independently represents a hydrogen atom or a linear or branched $C_{1-8}$ alkyl or alkenyl group; $R^{404}$ represents a hydrogen atom or a linear or branched $C_{1-8}$ alkyl or alkenyl group, or a group —$(R^{409})_h$—COOR' (R' representing a hydrogen atom or —$R^{409}$—COOH), and $R^{405}$ represents —$(CH_2)_i$— (i=2 to 10), a $C_{6-10}$ arylene group, a carbonyl group, a sulfonyl group, an oxygen atom, or a sulfur atom.

$R^{406}$ represents a $C_{1-10}$ alkylene group, a $C_{6-10}$ arylene group, a carbonyl group, a sulfonyl group, an oxygen atom, or a sulfur atom, $R^{407}$ represents a hydrogen atom, a linear or branched $C_{1-8}$ alkyl or alkenyl group, or a hydroxyl-substituted phenyl or naphthyl group, $R^{409}$ represents a linear or branched $C_{1-10}$ alkylene linkage, and $R^{410}$ represents a hydrogen atom, a linear or branched $C_{1-8}$ alkyl or alkenyl group, or a —$R^{411}$—COOH group.

$R^{411}$ represents a linear or branched $C_{1-10}$ alkylene linkage; j stands for an integer of 0 to 5; u and h each stands for 0 or 1; s1, t1, s2, t2, s3, t3, s4, and t4 are numbers which satisfy s1+t1=8, s2+t2=5, s3+t3=4, and s4+t4=6, and make each phenyl skeleton have at least one hydroxyl group, κ stands for a number which makes the compound of formula (A6) have a weight-average molecular weight of 1,000 to 5,000, and λ stands for a number which makes the compound of formula (A7) have a weight-average molecular weight of 1,000 to 10,000.

wherein, $R^{402}$, $R^{403}$, and $R^{411}$ have the same meanings as described above; $R^{412}$ represents a hydrogen atom or a hydroxyl group; s5 and t5 are numbers which satisfy s5≧0, t5≧0, and s5+t5≦5, and h' stands for 0 or 1.

Examples of this component include, but are not limited to, compounds represented by the below formulas AI-1 to AI-14 and AII-1 to AII-10

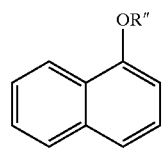

AI-1

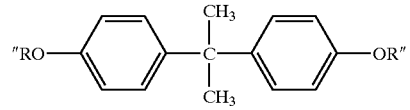 AI-2
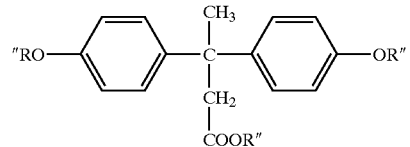 AI-3
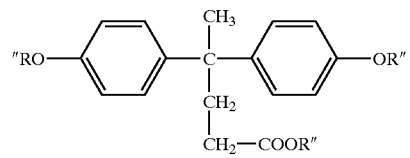 AI-4
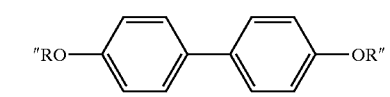 AI-5
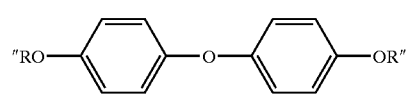 AI-6
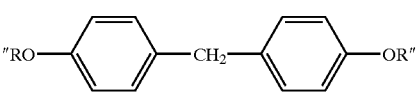 AI-7
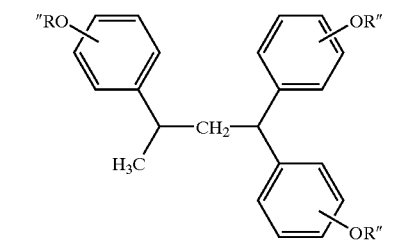 AI-8
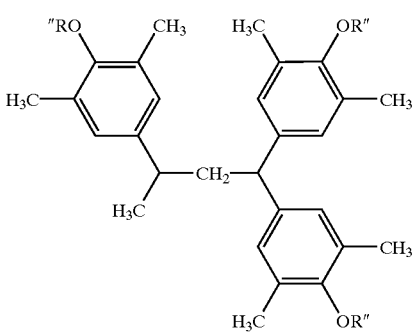 AI-9
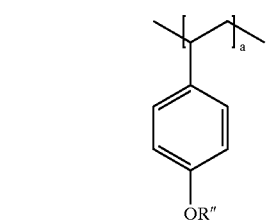 AI-10
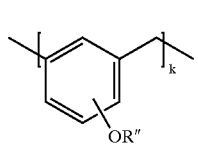 AI-11
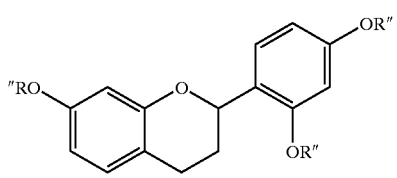 AI-12
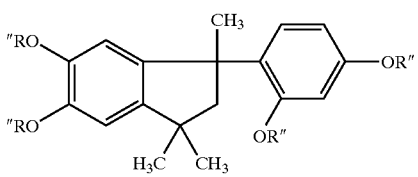 AI-13
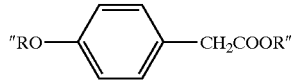 AI-14
wherein, R″ represents a hydrogen atom or a group $CH_2COOH$ and in each compound, the $CH_2COOH$ group accounts for 10 to 100 mol % of R″, α and κ have the same meanings as described above.
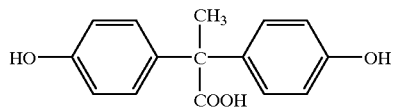 AII-1
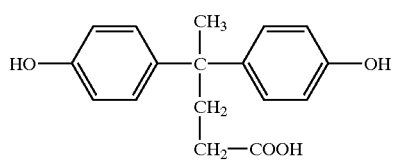 AII-2
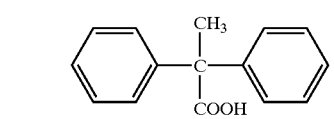 AII-3
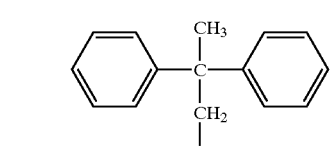 AII-4
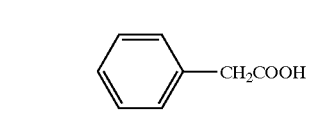 AII-5
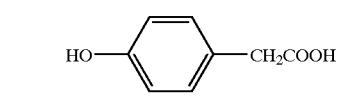 AII-6

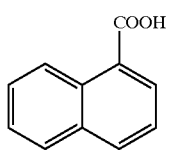
AII-7

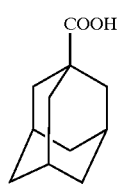
AII-8

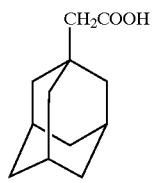
AII-9

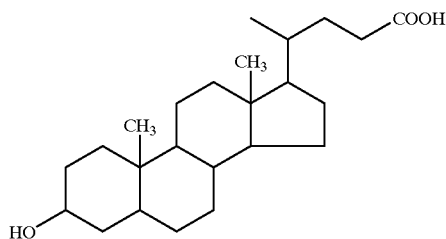
AII-10

The compounds having a group ≡C—COOH in the molecule thereof may be used either singly or in combination.

The compound having a group ≡C—COOH group in the molecule thereof is added in an amount of 0 to 5 parts by weight, preferably 0.1 to 5 parts by weight, more preferably 0.1 to 3 parts by weight, still more preferably 0.1 to 2 parts by weight, per 100 parts by weight of the base resin. Amounts exceeding 5 parts by weight may deteriorate the resolution of the resulting resist material.

To the resist material of the invention, an acetylene alcohol derivative can be incorporated as an additive. It can enhance the storage stability and moreover, improve the application properties.

Acetylene alcohol derivatives represented by the below formula (S1) or (S2) are preferred.

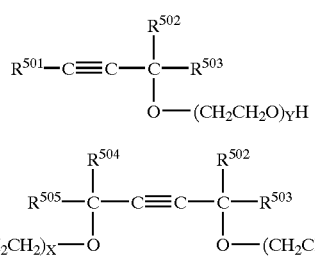

wherein, $R^{501}$, $R^{502}$, $R^{503}$, $R^{504}$, and $R^{505}$ each independently represents a hydrogen atom or a linear, branched, or cyclic $C_{1-8}$ alkyl group, and X and Y each stands for 0 or a positive number, satisfying the following equations: $0 \leq X \leq 30$, $0 \leq Y \leq 30$, and $0 \leq X+Y \leq 40$.

Preferred examples of the acetylene alcohol derivative include "Surfinol 61", "Surfinol 82", "Surfinol 104", "Surfinol 104E", "Surfinol 104H", "Surfinol 104A", "Surfinol TG", "Surfinol PC", "Surfinol 440", "Surfinol 465", and "Surfinol 485" (produced by Air Products and Chemicals Inc.), and "Surfinol E1004" (produced by Nisshin Chemical Industry Co., Ltd.).

The acetylene alcohol derivative is added in an amount of 0.01 to 2 wt %, more preferably 0.02 to 1 wt %, in 100 wt % of the resist composition. When the amount is less than 0.01 wt %, the composition may fail to attain sufficient effects for improving application properties and storage stability. Amounts exceeding 2 wt % may lower resolution of the resist material.

To the resist material of the invention, another optional component, preferably a surfactant commonly employed for improving the application properties, can be added. The optional component may be added in a conventional amount within an extent not disturbing the advantages of the invention.

As the surfactant, nonionic ones are preferred. Examples thereof include perfluoroalkylpolyoxyethylene ethanols, fluorinated alkyl esters, perfluoroalkylamine oxides, perfluoroalkyl/ethylene oxide adducts, and fluorinated organosiloxane compounds. Specific examples include "Florad FC-430 and FC-431" (produced by Sumitomo 3M Limited), "Surflon S-141 and S-145" (produced by Asahi Glass Company), "Unidain DS-401, DS-403 and DS-451" (produced by Daikin Industries, Ltd.), "Megafac F-8151" (trade name; product of Dainippon Ink and Chemicals, Inc.), and "X-70-092 and X-70-093" (produced by Shin-Etsu Chemical Co., Ltd.). Of these, "Florad FC-430" (produced by Sumitomo 3M) and "X-70-093" (produced by Shin-Etsu Chemical Co., Ltd.) are preferred.

Pattern formation using the resist material of the invention can be carried out by a known lithographic technique. For example, the resist material is applied onto a substrate such as silicon wafer by spin coating or the like to give a film thickness of 0.2 to 2.0 μm. The film is then pre-baked on a hot plate at 60 to 150° C. for 1 to 10 minutes, preferably at 80 to 130° C. for 1 to 5 minutes. A mask for forming a desired pattern is then placed over the resist film. Through the mask, the film is exposed to high energy beams or electron beams such as far-UV rays, an excimer laser, or x-rays to give a dose of about 1 to 200 mJ/cm², preferably about 5 to 100 mJ/cm², followed by post-exposure bake (PEB) on a hot plate at 60 to 150° C. for 1 to 5 minutes, preferably at 80 to 130° C. for 1 to 3 minutes. Then, development is carried out using, as the developer, an aqueous alkali solution such as a 0.1 to 5%, preferably 2 to 3% aqueous solution of tetramethylammonium hydroxide (TMAH) in a conventional manner, for example, dipping, puddling, or spraying for 0.1 to 3 minutes, preferably 0.5 to 2 minutes, whereby the desired pattern is formed on the substrate. The resist material of the invention is best suited to fine patterning with far-UV rays having a wavelength of 193 to 248 nm, an excimer laser, x-rays, or an electron beam among various high energy beams. Outside the above-described ranges of wavelength, it may not form the desired pattern.

The invention will hereinafter be described in detail by Examples. However, it should be borne in mind that the present invention is not limited to or by them.

EXAMPLES AND COMPARATIVE EXAMPLES

Performances of the resist materials prepared using each of thiol derivatives (PEDSs 1 to 4), a disulfide derivative (PEDS 5) and a thiolsulfonate derivative (PEDS 6) were evaluated. For comparison, a resist material without the above bis(alkylsulfonyl)methane derivative was also prepared and subjected to similar performance evaluation.

Components properly selected from polymers (Polymers 1 to 7) represented by the below formulas, photoacid generators (PAGs 1 to 4), dissolution inhibitors (DRRs 1 and 2) and a compound having a group of ≡C—COOH in the molecule thereof were mixed as described in Tables 1 and 3. A solvent containing 0.05 wt % of "FC-430" (produced by Sumitomo 3M) was employed. The solvents and basic compounds to be incorporated in each resist material are as follows.

PGMEA: propylene glycol methyl ether acetate
CyHo: cyclohexanone
TEA: triethanolamine
TMMEA: tris(2-methoxymethoxyethyl)amine
TAEA: tris(2-acetoxyethyl)amine

Examples 1 to 21

In each of Examples 1 to 21, a resist material prepared according to the composition as described below in the table was filtered through a Teflon filter having a pore size of 0.2 μm, whereby a resist solution was obtained. The resulting resist solution was spin-coated onto a silicon wafer, which had been coated at 77 nm with "ARC25-8" (produced by Nissan Chemical Industries, Ltd.), to give a thickness of 0.4 μm. The resulting silicon wafer was then baked at 110° C. for 90 seconds on a hot plate. The resist film was exposed using an ArF excimer laser stepper (product of Nikon Corporation; NA=0.55), followed by baking (PEB) at 110° C. for 90 seconds. The film was then developed with a 2.38% aqueous solution of tetramethylammonium hydroxide, whereby a positive pattern was obtained.

The resulting resist pattern was evaluated for the below-described items. First, the dose which provides a 1:1 resolution of a 0.20 μm line-and-space pattern was determined and it was designated as the sensitivity (mJ/cm$^2$). Next, the minimum line width (μm) of the line and space that separated at this dose was designated as the resolution of the evaluated resist. The shape of the resolved resist pattern was observed under a scanning electron microscope.

With regards to the evaluation on PED stability, the time from exposure to PEB in a stepper equipped with a chemical filter was changed to 5, 10, 15, 30, 45 and 60 minutes at the dose determined above and the time which did not permit resolution was used as an index of PED stability.

The composition and evaluation results of the resist materials are shown in Tables 1 and 2. The structure of the each of the resins used for them is also described together with its weight-average molecular weight (Mw).

Comparative Examples 1 to 7

In each of Comparative Examples 1 to 7, a resist material having the composition as shown in the below-described table was prepared and its performance was evaluated in the above-described manner.

The composition and evaluation results of each of the resist materials are shown in Tables 3 and 4.

From the results in Tables 1 to 4, it has been confirmed that the PED stability of each of the resist materials of the invention was higher than that of the conventional resist materials.

Polymer

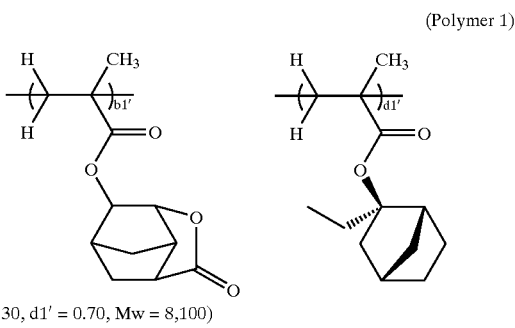

(Polymer 1)
(b1′ = 0.30, d1′ = 0.70, Mw = 8,100)

(Polymer 2)
(b1′ = 0.50, d1′ = 0.50, Mw = 9,500)

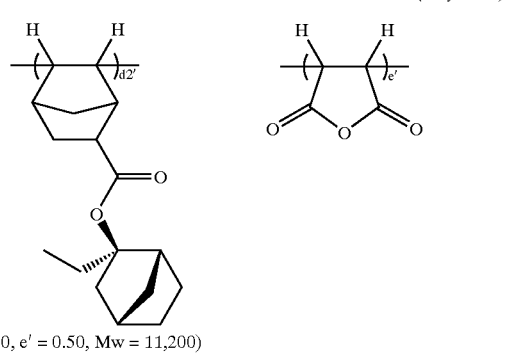

(Polymer 3)
(d2′ = 0.50, e′ = 0.50, Mw = 11,200)

(Polymer 4)
(d2′ = 0.50, e′ = 0.50, Mw = 12,300)

(Polymer 5)
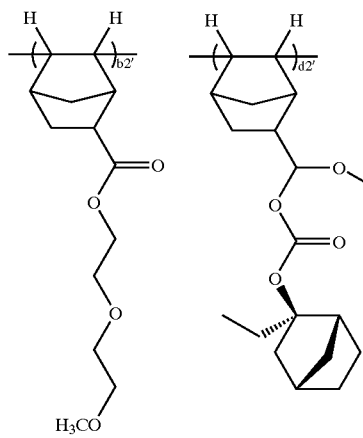
(b2' = 0.10, d2' = 0.40 e' = 0.50, Mw = 9,200)
(Polymer 6)
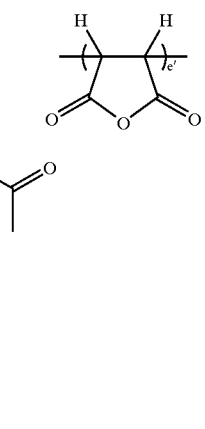
(b2' = 0.40, d2' = 0.60 Mw = 18,600)
(Polymer 7)
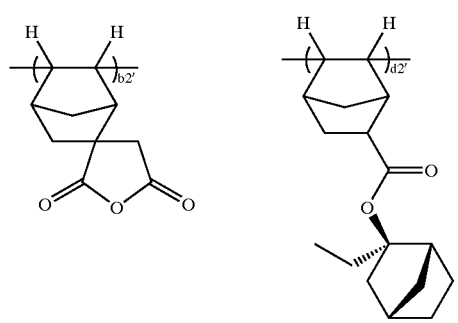
(b3' = 0.40, d3' = 0.60, Mw = 15,400)
PAG
(PAG 1)
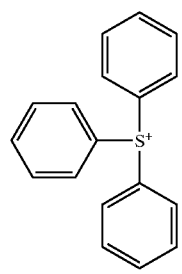
(PAG 2)
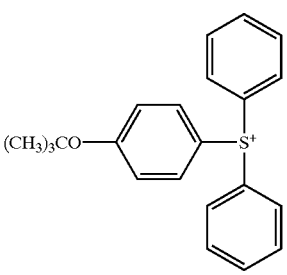
(PAG 3)
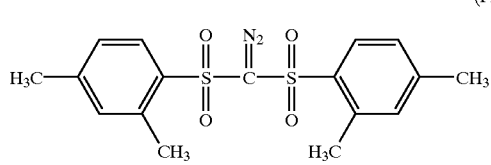
(PAG 4)
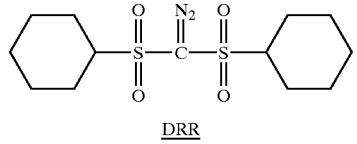
DRR
(DRR 1)
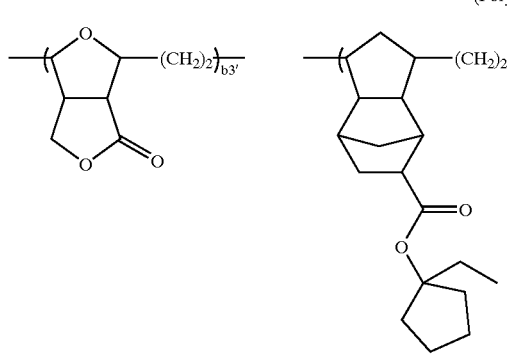
(DRR 2)
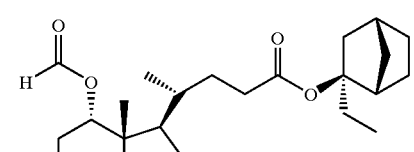
ACC
(ACC 1)
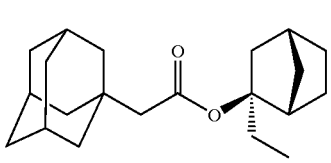
PEDS
(PEDS 1)
HOOC—SH
(PEDS 2)
HO—SH
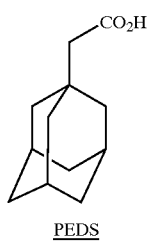
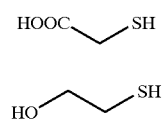

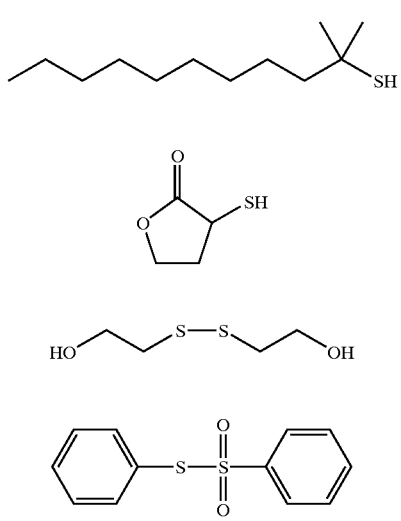

(PEDS 3)

(PEDS 4)

(PEDS 5)

(PEDS 6)

TABLE 2

| Example | Sensitivity (mJ/cm$^2$) | Resolution (μm) | Shape | Time which did not permit resolution (minutes) |
|---|---|---|---|---|
| 1 | 22 | 0.15 | rectangular | 60- |
| 2 | 23 | 0.15 | rectangular | 45–60 |
| 3 | 22 | 0.15 | rectangular | 45–60 |
| 4 | 21 | 0.15 | rectangular | 60- |
| 5 | 20 | 0.15 | rectangular | 60- |
| 6 | 21 | 0.18 | rectangular | 45–60 |
| 7 | 23 | 0.18 | rectangular | 60- |
| 8 | 21 | 0.14 | rectangular | 45–60 |
| 9 | 22 | 0.14 | rectangular | 45–60 |
| 10 | 22 | 0.14 | rectangular | 45–60 |
| 11 | 20 | 0.14 | rectangular | 45–60 |
| 12 | 19 | 0.14 | rectangular | 45–60 |
| 13 | 21 | 0.17 | rectangular | 45–60 |
| 14 | 25 | 0.18 | rectangular | 60- |
| 15 | 21 | 0.15 | rectangular | 60- |
| 16 | 22 | 0.15 | rectangular | 60- |
| 17 | 24 | 0.14 | rectangular | 45–60 |
| 18 | 23 | 0.14 | rectangular | 45–60 |
| 19 | 21 | 0.14 | rectangular | 60- |

TABLE 1

| Example | Resin (parts by weight) | Photoacid generator (parts by weight) | sulfur-containing compound (parts by weight) | dissolution inhibitor (parts by weight) | Basic compound (parts by weight) | Solvent (parts by weight) |
|---|---|---|---|---|---|---|
| 1 | Polymer1 (80) | PAG1 (1) | PEDS1 (1) | | TEA (0.12) | CyHo (550) |
| 2 | Polymer2 (80) | PAG1 (1) | PEDS1 (1) | | TEA (0.12) | PGMEA (450) |
| 3 | Polymer3 (80) | PAG1 (1) | PEDS1 (1) | | TEA (0.12) | PGMEA (450) |
| 4 | Polymer4 (80) | PAG1 (1) | PEDS1 (1) | | TEA (0.12) | PGMEA (450) |
| 5 | Polymer5 (80) | PAG1 (1) | PEDS1 (1) | | TEA (0.12) | PGMEA (450) |
| 6 | Polymer6 (80) | PAG1 (1) | PEDS1 (1) | | TEA (0.12) | CyHo (550) |
| 7 | Polymer7 (80) | PAG1 (1) | PEDS1 (1) | | TEA (0.12) | CyHo (550) |
| 8 | Polymer1 (80) | PAG1 (1) | PEDS2 (2) | | TAEA (0.12) | CyHo (550) |
| 9 | Polymer2 (80) | PAG1 (1) | PEDS2 (2) | | TAEA (0.12) | PGMEA (450) |
| 10 | Polymer3 (80) | PAG1 (1) | PEDS2 (2) | | TAEA (0.12) | PGMEA (450) |
| 11 | Polymer4 (80) | PAG1 (1) | PEDS3 (2) | | TAEA (0.12) | PGMEA (450) |
| 12 | Polymer5 (80) | PAG1 (1) | PEDS4 (2) | | TAEA (0.12) | PGMEA (450) |
| 13 | Polymer6 (80) | PAG1 (1) | PEDS5 (2) | | TAEA (0.12) | CyHo (550) |
| 14 | Polymer7 (80) | PAG1 (1) | PEDS6 (2) | | TAEA (0.12) | CyHo (550) |
| 15 | Polymer1 (75) | PAG3,4 (1),(1) | PEDS5 (1.5) | DRR1 (5) | TMMEA (0.12) | CyHo (550) |
| 16 | Polymer2 (75) | PAG3,4 (1),(1) | PEDS5 (1.5) | DRR2 (5) | TMMEA (0.12) | PGMEA (450) |
| 17 | Polymers3,5 (40),(40) | PAG2 (1) | PEDS5 (1.5) | | TMMEA (0.12) | PGMEA (450) |
| 18 | Polymers4,5 (40),(40) | PAG2 (1) | PEDS5 (1.5) | | TMMEA (0.12) | PGMEA (450) |
| 19 | Polymers1,5 (20),(60) | PAG2 (1) | PEDS5 (1.5) | | TMMEA (0.12) | PGMEA (450) |
| 20 | Polymer6 (70) | PAG2 (1) | PEDS6 (1.5) | DRR1,ACC1 (5),(5) | TMMEA (0.12) | CyHo (550) |
| 21 | Polymer7 (80) | PAG2 (1) | PEDS6 (1.5) | | TMMEA (0.12) | CyHo (550) |

TABLE 2-continued

| Example | Sensitivity (mJ/cm$^2$) | Resolution ($\mu$m) | Shape | Time which did not permit resolution (minutes) |
|---|---|---|---|---|
| 20 | 23 | 0.18 | rectangular | 60- |
| 21 | 24 | 0.18 | rectangular | 60- |

TABLE 3

| Comparative Example | Resin (parts by weight) | Photoacid generator (parts by weight) | sulfur containing compound (parts by weight) | dissolution inhibitor (parts by weight) | Basic compound (parts by weight) | Solvent (parts by weight) |
|---|---|---|---|---|---|---|
| 1 | Polymer1 (80) | PAG1 (1) | — | — | TEA (0.12) | CyHo (550) |
| 2 | Polymer2 (80) | PAG1 (1) | — | — | TEA (0.12) | PGMEA (450) |
| 3 | Polymer3 (80) | PAG1 (1) | — | — | TEA (0.12) | PGMEA (450) |
| 4 | Polymer4 (80) | PAG1 (1) | — | — | TEA (0.12) | PGMEA (450) |
| 5 | Polymer5 (80) | PAG1 (1) | — | — | TEA (0.12) | PGMEA (450) |
| 6 | Polymer6 (80) | PAG1 (1) | — | — | TEA (0.12) | CyHo (550) |
| 7 | Polymer7 (80) | PAG1 (1) | — | — | TEA (0.12) | CyHo (550) |

TABLE 4

| Comparative Example | Sensitivity (mJ/cm$^2$) | Resolution ($\mu$m) | Shape | Time which did not permit resolution (minutes) |
|---|---|---|---|---|
| 1 | 24 | 0.15 | rectangular | 15–30 |
| 2 | 25 | 0.15 | rectangular | 10–15 |
| 3 | 25 | 0.15 | rectangular | 10–15 |
| 4 | 24 | 0.15 | rectangular | 15–30 |
| 5 | 21 | 0.15 | rectangular | 15–30 |
| 6 | 23 | 0.18 | rectangular | 10–15 |
| 7 | 26 | 0.18 | rectangular | 15–30 |

What is claimed is:

1. A resist material comprising:
   (A) an organic solvent,
   (B) a resin which exhibits transmittance of 30%/.mu.m or greater at a wavelength of 193 nm, is an alkali insoluble or alkali sparingly soluble resin protected with an acid labile group, and has an alicyclic structure having a —(CO)—O—(CO)$_k$— group (in which, k stands for 0 or 1) which becomes alkali soluble upon dissociation of said acid labile group,
   (C) a photoacid generator,
   (D) a basic compound, and
   (E) at least one compound selected from the group consisting of thiol derivatives, disulfide derivatives and thiolsulfonate derivatives.

2. A resist material of claim 1, further comprising (F) a dissolution inhibitor.

3. A pattern forming method, which comprises steps of applying a resist material according to claim 2 onto a substrate; after a heat treatment, exposing the resist material to a high energy beam or electron beam through a photomask; and after an optional heat treatment, developing the resist material with a developer.

4. A resist material according to claim 2, further comprising (G) a surfactant.

5. A pattern forming method, which comprises steps of applying a resist material according to claim 4 onto a substrate; after a heat treatment, exposing the resist material to a high energy beam or electron beam through a photomask; and after an optional heat treatment, developing the resist material with a developer.

6. A resist material according to claim 1, further comprising (G) a surfactant.

7. A pattern forming method, which comprises steps of applying a resist material according to claim 6 onto a substrate; after a heat treatment, exposing the resist material to a high energy beam or electron beam through a photomask; and after an optional heat treatment, developing the resist material with a developer.

8. A pattern forming method, which comprises steps of applying a resist material according to claim 1 onto a substrate; after a heat treatment, exposing the resist material to a high energy beam or electron beam through a photomask; and after an optional heat treatment, developing the resist material with a developer.

9. A resist material of claim 1, wherein the thiol derivatives are each free of a carbon-carbon double bond.

10. A resist material according to claim 9, further comprising (G) a surfactant.

11. A pattern forming method, which comprises steps of applying a resist material according to claim 10 onto a substrate; after a heat treatment, exposing the resist material to a high energy beam or electron beam through a photomask; and after an optional heat treatment, developing the resist material with a developer.

12. A resist material of claim 9, further comprising (F) a dissolution inhibitor.

13. A pattern forming method, which comprises steps of applying a resist material according to claim 12 onto a substrate; after a heat treatment, exposing the resist material to a high energy beam or electron beam through a photomask; and after an optional heat treatment, developing the resist material with a developer.

14. A resist material according to claim 12, further comprising (G) a surfactant.

15. A pattern forming method, which comprises steps of applying a resist material according to claim 14 onto a substrate; after a heat treatment, exposing the resist material to a high energy beam or electron beam through a photomask; and after an optional heat treatment, developing the resist material with a developer.

16. A pattern forming method, which comprises steps of applying a resist material according to claim 9 onto a substrate; after a heat treatment, exposing the resist material to a high energy beam or electron beam through a photomask; and after an optional heat treatment, developing the resist material with a developer.

* * * * *